(12) United States Patent
Yau et al.

(10) Patent No.: US 10,886,907 B1
(45) Date of Patent: Jan. 5, 2021

(54) METHOD OF CONTROLLING RESOLUTION OF DIGITAL PULSE WIDTH MODULATION

(71) Applicant: ASIAN POWER DEVICES INC., Taoyuan (TW)

(72) Inventors: Yeu-Torng Yau, Taoyuan (TW); Tsung-Liang Hung, Taoyuan (TW)

(73) Assignee: ASIAN POWER DEVICES INC., Taoyuan (TW)

( * ) Notice: Subject to any disclaimer, the term of this patent is extended or adjusted under 35 U.S.C. 154(b) by 0 days.

(21) Appl. No.: 16/717,371

(22) Filed: Dec. 17, 2019

(30) Foreign Application Priority Data

Oct. 25, 2019 (TW) .............................. 108138648 A (51) Int. Cl.
| | |
|---|---|
| *H03K 7/08* | (2006.01) |
| *H02M 3/157* | (2006.01) |
| *H03M 3/00* | (2006.01) |

(52) U.S. Cl.
CPC .............. *H03K 7/08* (2013.01); *H02M 3/157* (2013.01); *H03M 3/506* (2013.01)

(58) Field of Classification Search
CPC ......... H03K 7/08; H03K 3/017; H03M 3/506; H02M 3/157
See application file for complete search history.

(56) References Cited

U.S. PATENT DOCUMENTS

2019/0312581 A1\* 10/2019 Lamanna .............. H03L 7/0993

\* cited by examiner

*Primary Examiner* — Jung Kim
(74) *Attorney, Agent, or Firm* — Muncy, Geissler, Olds & Lowe, P.C.

(57) ABSTRACT

A method of controlling a resolution of digital pulse width modulation is applied to a digital pulse width modulation generator. The method is to divide a value of a first duty clock by a value of a first pulse width modulation period clock to generate a first resolution. And then, if it is confirmed that a modulation command has been received, a second resolution is generated, and if it is confirmed that the modulation command is not received, a third resolution is generated. The second resolution is greater than the first resolution, and the second resolution is less than the third resolution.

5 Claims, 6 Drawing Sheets

METHOD OF CONTROLLING RESOLUTION OF DIGITAL PULSE WIDTH MODULATION

BACKGROUND

Technical Field

The present disclosure relates to a method of controlling a resolution, and more particularly to a method of controlling a resolution of a digital pulse width modulation applied to a digital pulse width modulation generator.

Description of Related Art

The statements in this section merely provide background information related to the present disclosure and do not necessarily constitute prior art.

In analog circuits, a value of an analog signal may be smoothly changed, almost any value can be chosen for a magnitude of time and value, an input and an output also vary linearly. However, analog circuits have many problems, such as control signals that are prone to drift over time, difficult to adjust, high power consumption, and easy to be disturbed by noise signal and environmental factors. Unlike analog circuits, digital circuits take values within a predetermined range, outputs at any time can only be ON (or call high level) or OFF (or call low level). Therefore, a voltage or a current of digital circuits is transmitted to a load according to turn-ON and turn-OFF of repeated pulse wave sequence. A control method for the repeated pulse wave sequence is a digital pulse width modulation (DPWM) technique, which is a method for digitally encoding an analog signal. The method for digitally encoding an analog signal is achieved by modulating a duty ratio of a square wave using an adjustable resolution counter.

In general, conventional method of DPWM technology often requires electronic components (such as CPU, DSP, etc.) to operate at very high frequencies in order to achieve a desired output resolution and avoid to generate limit cycle oscillations of output voltage. However, the electronic components suitable for high frequency are expensive, and consuming more power. There is another conventional method called a dither method, the dither method averages multiple duty cycles with fast dithers in a specific period to achieve an equivalent improvement for a resolution of DPWM. However, the dither method tends to produce higher output voltages and current ripples.

Therefore, how to design a method of controlling a resolution of digital pulse width modulation to solve the technical problems above is an important subject studied by the inventors and proposed in the present disclosure. In particular, an accuracy of a controllable resolution is improved without increasing maximum operating frequency of the electronic components, making it easier for user to obtain the desired output resolution.

SUMMARY

A purpose of the present disclosure is to provide a method of controlling a resolution of digital pulse width modulation, which can improve the accuracy of the adjustable resolution without increasing the maximum operating frequency of the electronic components. It is easy for the user to obtain the required output resolution while avoid to generate limit cycle oscillations of output voltage and current ripples of output current. Thereby, achieving the purpose of easy to operate, reducing power components and improving the quality of the output signal.

In order to achieve the purpose above-mentioned, the method of controlling a resolution of digital pulse width modulation includes the steps as follows. Generating a first duty clock and a first pulse width modulation period clock, and dividing a value of the first duty clock by a value of the first pulse width modulation period clock to generate a first resolution. Remaining unchanged the first duty clock when confirming that a modulation command has been received, subtracting a first specific value from the value of the first pulse width modulation period clock to generate a second pulse width modulation period clock, and dividing the value of the first duty clock by a value of the second pulse width modulation period clock to generate a second resolution. And, remaining unchanged the first pulse width modulation period clock when confirming that the modulation command has not been received, increasing the value of the first duty clock by a second specific value to generate a second duty clock, and dividing a value of the second duty clock by the value of the first pulse width modulation period clock to generate a third resolution. The second resolution is greater than the first resolution, and the second resolution is less than the third resolution.

Further, the method of controlling a resolution of digital pulse width Modulation further includes following steps of: Receiving a control amount including a plurality of bits. And, deleting the last bit of the last control amount, and the second to last bit of the control amount used as the modulation command.

Further, the method of controlling a resolution of digital pulse width modulation as above-mentioned, the first specific value is a least significant bit (LSB) of duty cycle of the first pulse width modulation period clock, the second specific value is a least significant bit of duty cycle of the first duty clock.

When the method of controlling a resolution of digital pulse width modulation in the present disclosure is used, for the digital pulse width modulation generator, the first resolution is generated by dividing the value of the first duty clock by the value of the first pulse width modulation (PWM) period clock. Basically, a PWM period clock of conventional method is fixed, so the resolution of conventional method is completely determined by the duty clock. The conventional method can only change the resolution by adjusting the duty clock. However, the conventional method is limited by the maximum operating frequency of the PWM period clock, and thus the accuracy of the controllable resolution cannot be improved. The first duty clock and the first PWM period clock of the present disclosure are controlled by the modulation command. And without changing a maximum value of adjustable values of the first PWM period clock (i.e., the maximum operating frequency of the electronic components), can create the second resolution between the first resolution and the third resolution by pulse frequency modulation (PFM) method with minimal required adjustment.

To this end, the present disclosure can improve the accuracy of the controllable resolution (i.e., the resolution of digital puke width modulation) by an appropriate configuration of the modulation command, the first specific value, and the second specific value. The output resolution can be approximated or matched with a smaller adjustment range. It is easy for the user to obtain the required output resolution while avoid to generate limit cycle oscillations of output voltage and current ripples of output current. Thereby, achieving the purpose of easy to operate, reducing power components and improving the quality of the output signal. Further, the PFM method with minimal required adjustment also helps to disperse electromagnetic interference (EMI) in whole spectrum and can reduce an influence by EMI.

In order to further understand the techniques, means, and effects of the present disclosure for achieving the intended purpose. Please refer to the following detailed description and drawings of the present disclosure. The drawings are provided for reference and description only, and are not intended to limit the present disclosure.

DETAILED DESCRIPTION

The embodiments of the present disclosure are described by way of specific examples, and those skilled in the art can readily appreciate the other advantages and functions of the present disclosure. The present disclosure may be embodied or applied in various other specific embodiments, and various modifications and changes can be made without departing from the spirit and scope of the present disclosure.

It should be understood that the structures, the proportions, the sizes, the number of components, and the like in the drawings are only used to cope with the contents disclosed in the specification for understanding and reading by those skilled in the art, and it is not intended to limit the conditions that can be implemented in the present disclosure, and thus is not technically significant. Any modification of the structure, the change of the proportional relationship, or the adjustment of the size, should be within the scope of the technical contents disclosed by the present disclosure without affecting the effects and the achievable effects of the present disclosure.

The technical content and detailed description of the present disclosure will be described below in conjunction with the drawings.

Figure 1:
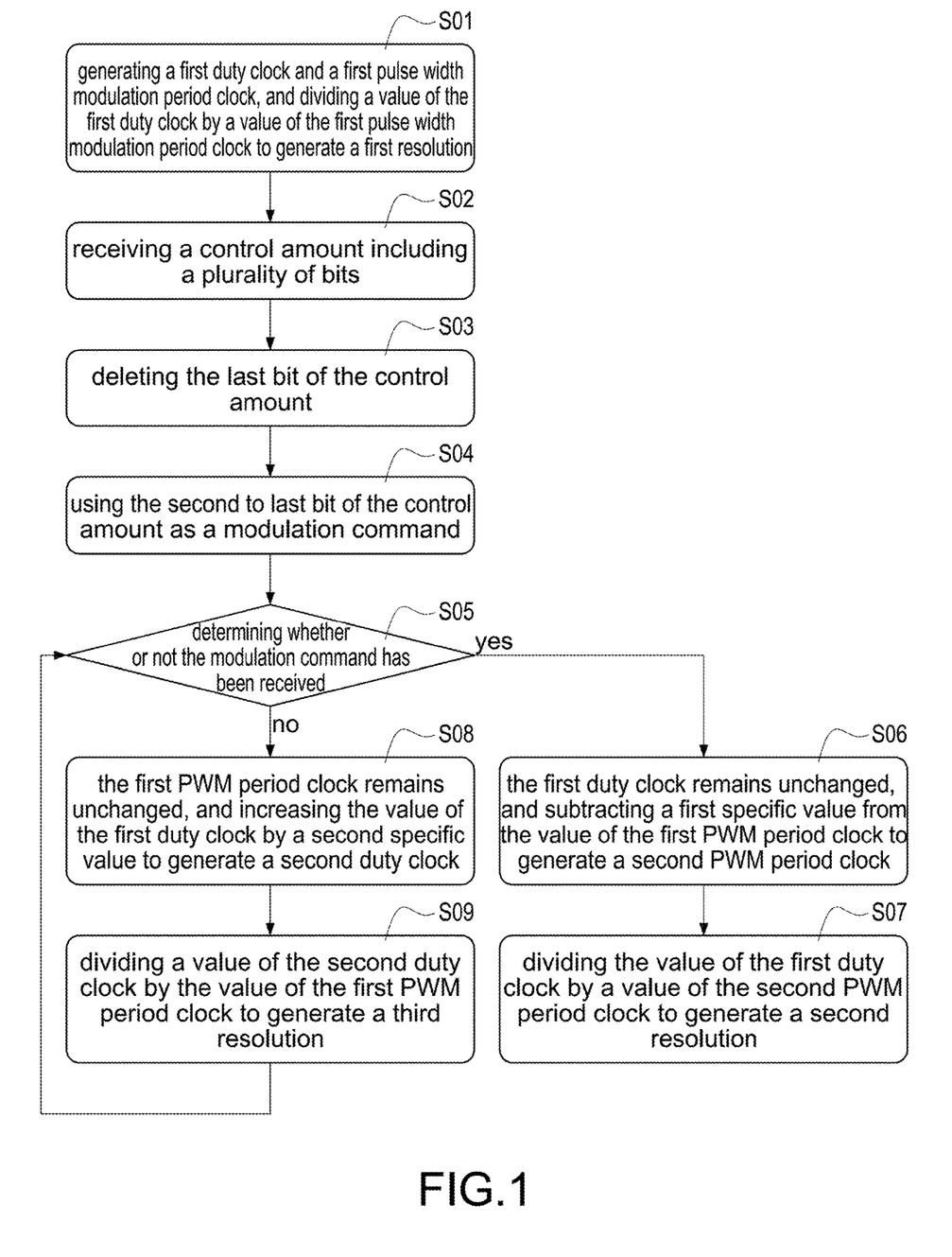
FIG. 1 is a flowchart of a method of controlling a resolution of a digital pulse width modulation of the present disclosure.

Please refer to FIG. 1, the FIG. 1 is a flowchart of a method of controlling a resolution of a digital pulse width modulation of the present disclosure. The method of controlling the resolution of the digital pulse width modulation of the present disclosure is applied to a digital pulse width modulation (DPWM) generator, the method includes the following steps of: generating a first duty clock and a first pulse width modulation (PWM) period clock, and dividing a value of the first duty clock by a value of the first PWM period clock to generate a first resolution (step S01).

Afterward, receiving a control amount including a plurality of bits (step S02). And then, deleting the last bit of the control amount (step S03), and using the second to last bit of the control amount as a modulation command (step S04), and then determining whether or not the Modulation command has been received (step S05).

When the modulation command has been received (i.e., the determination in step S05 is YES), the first duty clock remains unchanged, and subtracting a first specific value from the value of the first PWM period clock to generate a second PWM period clock (step S06), and dividing the value of the first duty clock by a value of the second PWM period clock to generate a second resolution (step S07). The second resolution is greater than the first resolution.

When the modulation command has not been received (i.e., the determination in step S05 is NO), the first PWM period clock remains unchanged, and increasing the value of the first duty clock by a second specific value to generate a second duty clock (step S08), and dividing a value of the second duty clock by the value of the first PWM period clock to generate a third resolution (step S09). The second resolution is greater than the first resolution, and the second resolution is less than the third resolution. In the method of controlling the resolution of the digital pulse width modulation of the present disclosure, after confirming that the modulation command has not been received and the third resolution is not generated (step S09), if a stop command (not shown) is not explicitly received or if all process has not been stopped, it is re-executed to confirm whether or not the modulation command has been received (step S05). In the embodiment of the present disclosure, the digital pulse width modulation (DPWM) generator may allow 9 bits input, and the control amount may be 11 bits. The processing method of prior art is to directly delete the last two bits of the control amount to generate 9 bits input compatible with a DPWM generator. In the present disclosure, only the last bit of the control amount has been deleted, and the second to last bit of the control amount can be controlled as the modulation command. For example, when the second to last bit of the control amount is 0, it is configured to determine that the modulation command has not been received. When the second to last bit of the control amount is 1, it is configured to determine that the modulation command has been received.

When the method of controlling a resolution of digital pulse width modulation in the present disclosure is used, for the digital pulse width modulation generator the first resolution is generated by dividing the value of the first duty clock by the value of the first PWM period clock. Basically, a PWM period clock of conventional method is fixed, so the resolution of conventional method is completely determined by the duty clock. The conventional method can only change the resolution by adjusting the duty clock. However, the conventional method is limited by the maximum operating frequency of the PWM period clock, and thus the accuracy of the controllable resolution cannot be improved. The first duty clock. and the first PWM period clock of the present disclosure are controlled by the modulation command. And without changing a maximum value of adjustable values of the first PWM period clock (i.e., the maximum operating frequency of the electronic components), can create the second resolution between the first resolution and the third resolution by pulse frequency modulation (PFM) method with minimal required adjustment. In the first embodiment of the present disclosure, the first specific value is a least significant bit (LSB) of duty cycle of the first PWM period clock, the second specific value is an LSB of duty cycle of the first duty clock. That is, when the second to last bit of the control amount is 1, it is considered that the modulation command has been received. When the second to last bit of the control amount has been deleted, meanwhile the second to last bit of the control amount is the LSB.

Figure 2:
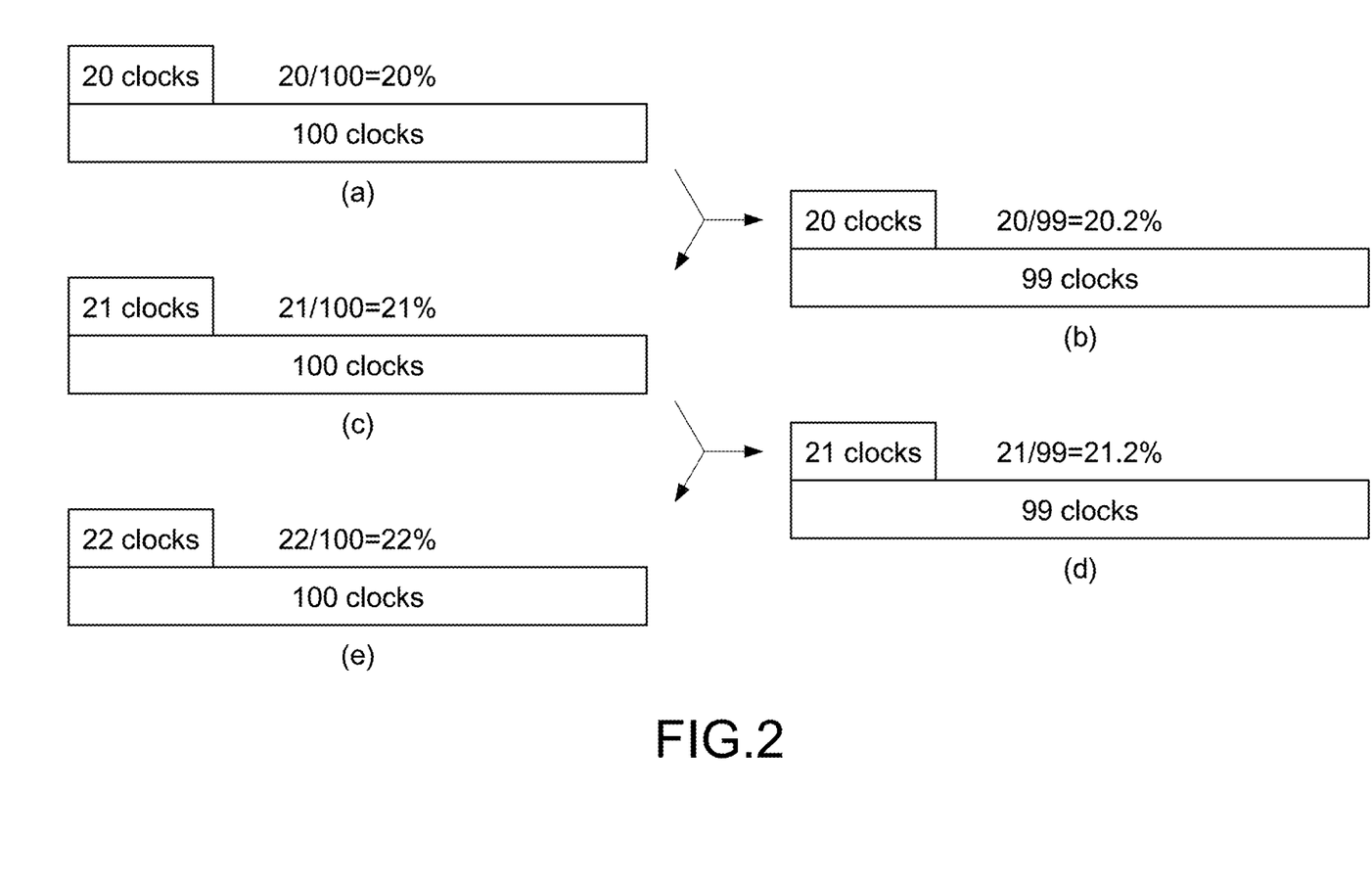
FIG. 2 is a schematic diagram of a first embodiment of the method of controlling the resolution of the digital pulse width modulation of the present disclosure.

Please refer to FIG. 2, the FIG. 2 is a schematic diagram of a first embodiment of the method of controlling the resolution of the digital pulse width modulation of the present disclosure. In the first embodiment of the present disclosure, the first duty clock is 20 clocks, the first PWM period clock is 100 clocks, and the first specific value and the second specific value are both 1 clock. As shown in (a) of the FIG. 2, therefore the first resolution is 20%.

When the modulation command has not been received, the first PWM period clock (i.e., 100 clocks) remains unchanged (i.e., the maximum operating frequency of the DPWM generator is maintained), increasing the value of the first duty clock (i.e., 20 clocks) by a second specific value (i.e., 1 clock) to generate a second duty clock (i.e., 21 clocks). As shown in (c) of the FIG. 2, dividing a value of the second duty clock (i.e., 21 clocks) by the value of the first PWM period clock (i.e., 100 clocks) to generate a third resolution (i.e., 21/100=21%). After confirming that the modulation command has not been received and the third resolution is not generated, if a stop command (not shown) is not explicitly received or if all process has not been stopped, it is re-executed to confirm whether or not the modulation command has been received.

When confirming that the modulation command has been received, the first duty clock (i.e., 20 clocks) remains unchanged, subtracting a first specific value (i.e., 1 clock) from the value of the first PWM period clock (i.e., 100 clocks) to generate a second PWM period clock (i.e., 99 clocks). As shown in (b) of the FIG. 2, dividing the value of the first duty clock (i.e., 20 clocks) by a value of the second PWM period clock (i.e., 99 clocks) to generate a second resolution (i.e., 20/99=20.2%).

By analogy, based on (c) of the FIG. 2, the resolution at the next stage is 21.2% within (d) of the FIG. 2, and 22% within (e) of the FIG. 2. The first embodiment of the present disclosure creates a resolution of 20.2% and 21.2% compared to the conventional method without increasing the maximum operating frequency of the DPWM generator. The conventional method can only provide the resolution is 20%, 21% and 22%.

Figure 3A:
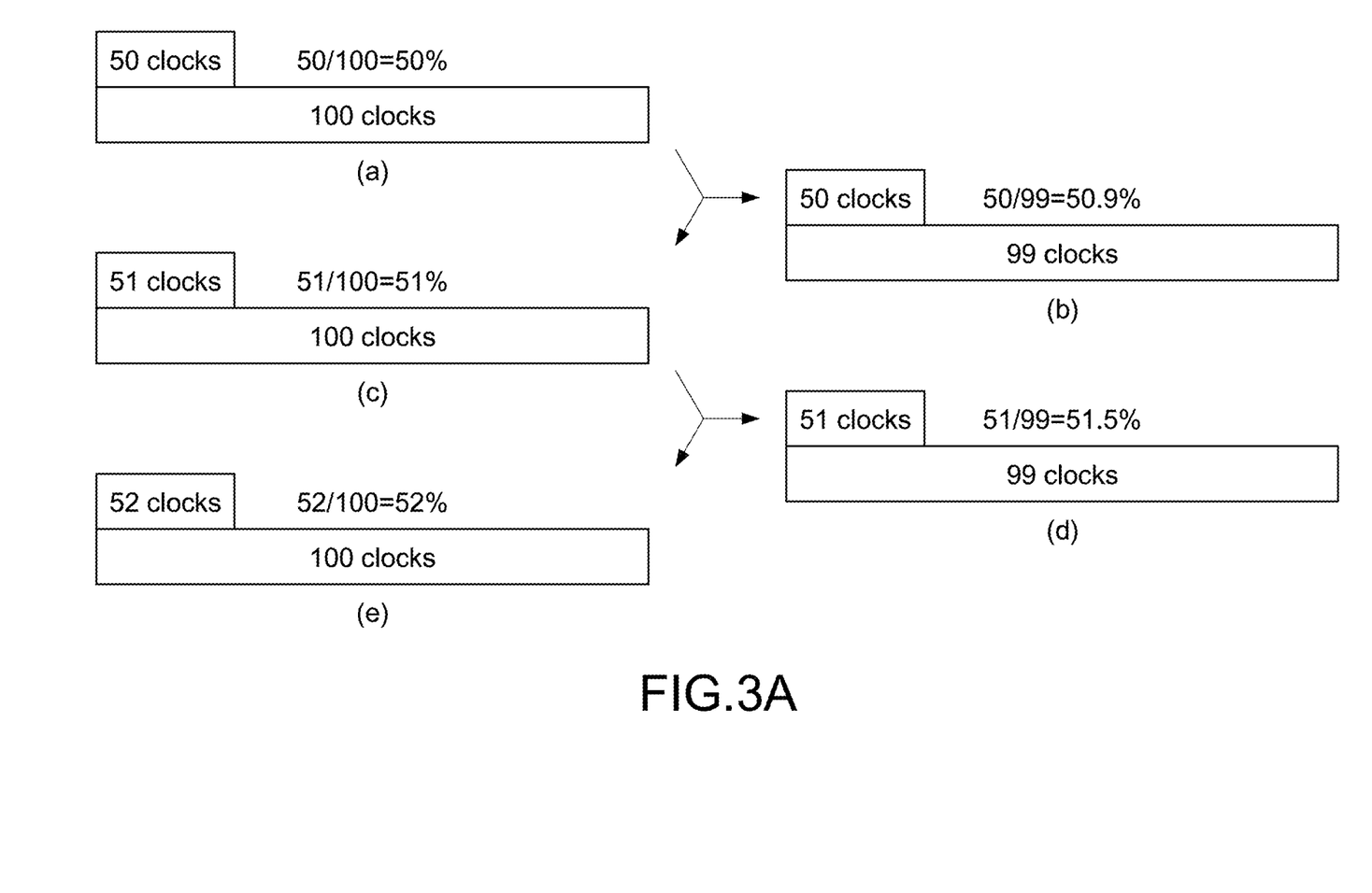
FIG. 3A is a schematic diagram of a second embodiment of the method of controlling the resolution of the digital pulse width modulation of the present disclosure.
Figure 3B:
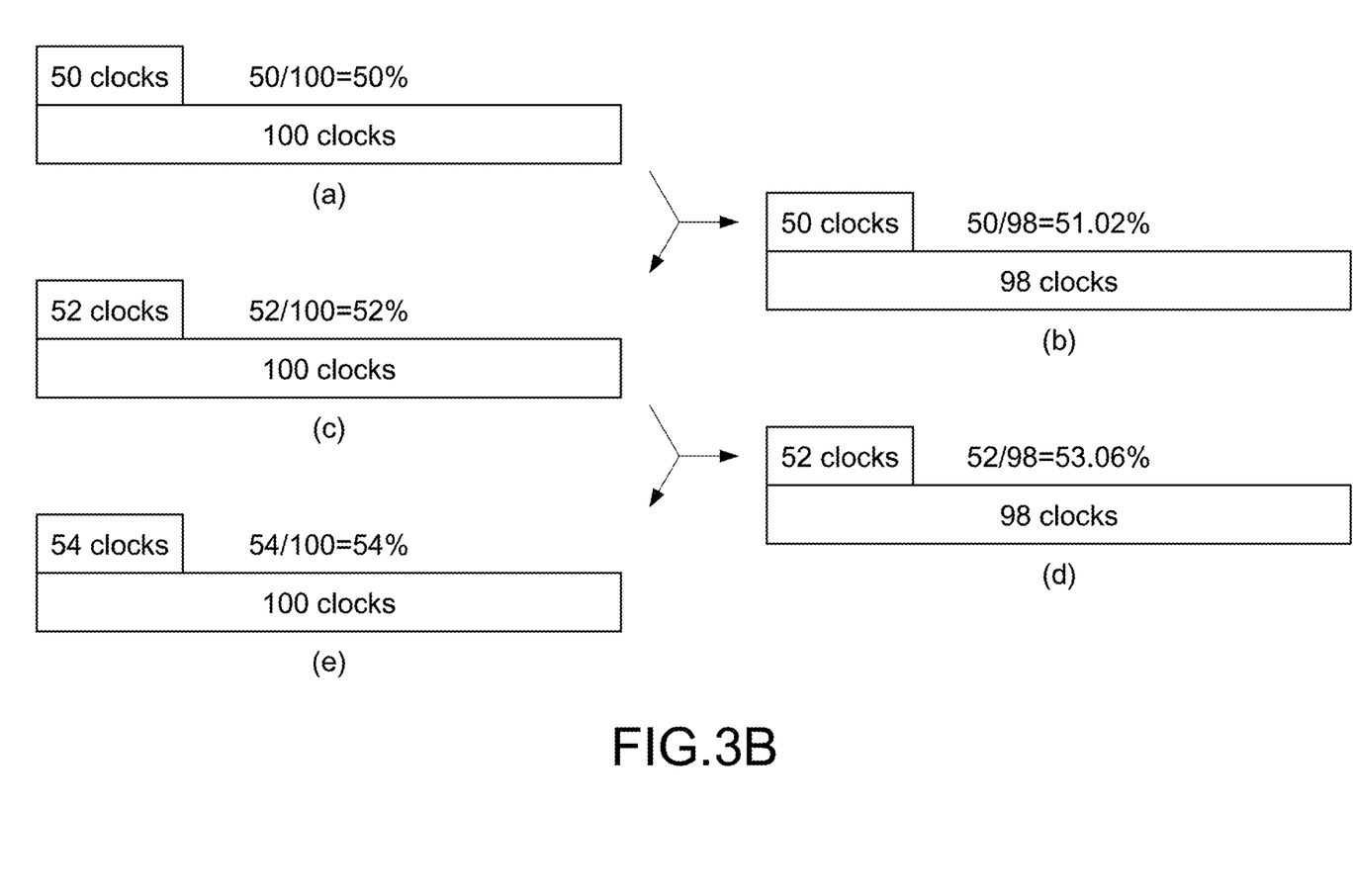
FIG. 3B is a schematic diagram of a third embodiment of the method of controlling the resolution of the digital pulse width modulation of the present disclosure.

Please refer to FIGS. 3A and FIG. 3B. The FIG. 3A is a schematic diagram of a second embodiment of the method of controlling a resolution of a digital pulse width modulation of the present disclosure. The FIG. 3B is a schematic diagram of a third embodiment of the method of controlling a resolution of a digital pulse width modulation of the present disclosure.

As shown in the FIG. 3A, the second embodiment of the present disclosure is substantially the same as the first embodiment described above, except that the first duty clock is 50 clocks.

When confirming that the modulation command has not been received, the first PWM period clock (i.e., 100 clocks) remains unchanged (i.e., the maximum operating frequency of the DPWM generator is maintained), increasing the value of the first duty clock (i.e., 50 clocks) by a second specific value (ie., 1 clock) to generate a second duty clock (i.e., 51 clocks). As shown in (c) of the FIG. 3A, dividing a value of the second duty clock (i.e., 51 clocks) by the value of the first PWM period clock (i.e., 100 clocks) to generate a third resolution (i.e., 51/100=51%). After confirming that the modulation command has not been received and the third resolution is not generated, if a stop command (not shown) is not explicitly received or if all process has not been stopped, it is re-executed to confirm whether or not the modulation command has been received.

When confirming that the modulation command has been received, the first duty clock (i.e., 50 clocks) remains unchanged, subtracting a first specific value (i.e., 1 clock) from the value of the first PWM period clock (i.e., 100 clocks) to generate a second PWM period clock (i.e., 99 clocks), As shown in (b) of the FIG. 3A, dividing the value of the first duty clock (i.e., 50 clocks) by a value of the second PWM period clock (i.e., 99 clocks) to generate a second resolution (i.e., 50/99=50.9%).

By analogy, based on (c) of the FIG. 3A, the resolution at the next stage is 51.5% within (d) of the FIG. 3A, and 52% within (e) of the FIG. 3A. The second embodiment of the present disclosure creates a resolution of 50.9% and 51.5% compared to the conventional method without increasing the maximum operating frequency of the DPWM generator. The conventional method can only provide the resolution is 50%, 51% and 52%.

As shown in the FIG. 3B, the third embodiment of the present disclosure is substantially the same as the second embodiment described above, except that the first specific value and the second specific value both are 2 clocks.

When confirming that the modulation command has not been received, the first PWM period clock (i.e., 100 clocks) remains unchanged (i.e., the maximum operating frequency of the DPWM generator is maintained), increasing the value of the first duty clock (i.e., 50 clocks) by a second specific value (i.e., 2 clocks) to generate a second duty clock (i.e., 52 clocks). As shown in (c) of the FIG. 3B, dividing a value of the second duty clock (i.e., 52 clocks) by the value of the first PWM period clock (i.e., 100 clocks) to generate a third resolution (i.e., 52/100=52%). After confirming that the modulation command has not been received and the third resolution is not generated, if a stop command (not shown) is not explicitly received or if all process has not been stopped, it is re-executed to confirm whether or not the modulation command has been received.

When confirming that the modulation command has been received, the first duty clock (i.e., 50 clocks) remains unchanged, subtracting a first specific value (i.e., 2 clock) from the value of the first PWM period clock (i.e., 100 clocks) to generate a second PWM period clock (i.e., 98 clocks). As shown in (b) of the FIG. 3B, dividing the value of the first duty clock (i.e., 50 clocks) by a value of the second PWM period clock (i.e., 98 clocks) to generate a second resolution (i.e., 50/98=51.02%).

By analogy, based on (c) of the FIG. 3B, the resolution at the next stage is 53.06% within (d) of the FIG. 3B, and 54% within (e) of the FIG. 3B. The third embodiment of the present disclosure creates a resolution of 51.02% and 53.06% compared to the conventional method without increasing the maximum operating frequency of the DPWM generator. The conventional method can only provide the resolution is 50%, 52% and 54%.

Figure 4A:
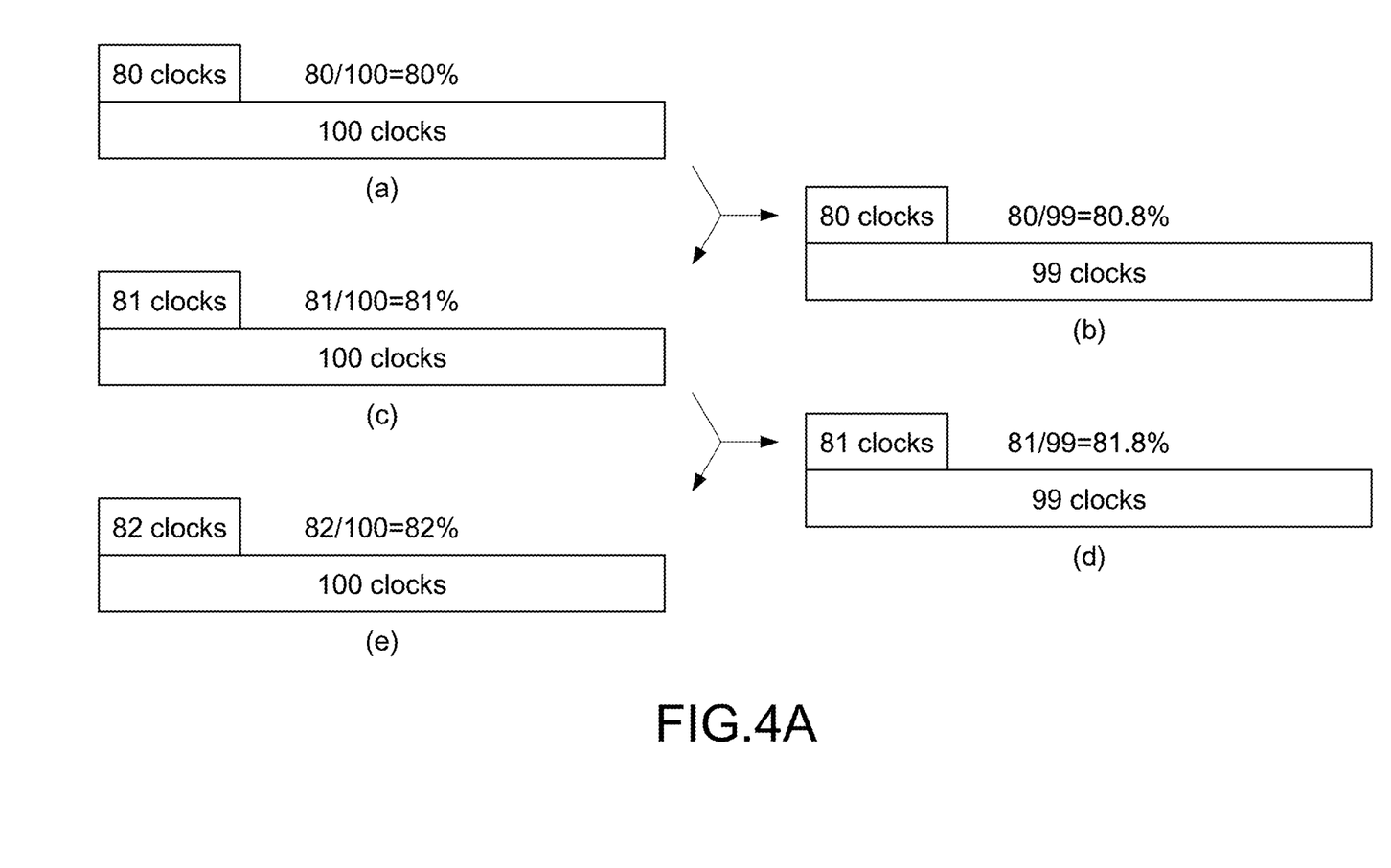
FIG. 4A is a schematic diagram of a fourth embodiment of the method of controlling the resolution of the digital pulse width modulation of the present disclosure.
Figure 4B:
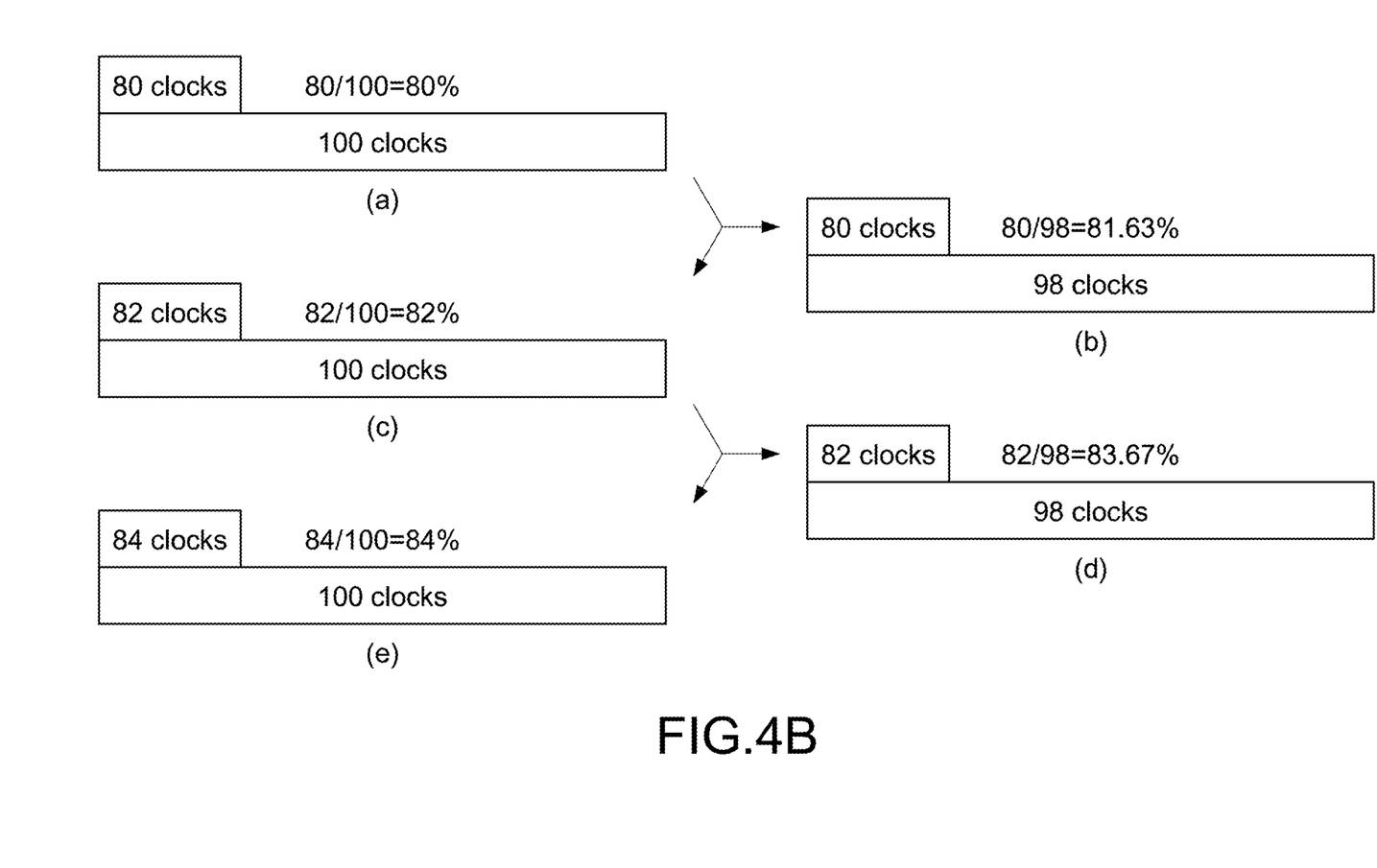
FIG. 4B is a schematic diagram of a fifth embodiment of the method of controlling the resolution of the digital pulse width modulation of the present disclosure.

Please refer to FIGS. 4A and FIG. 4B. The FIG. 4A is a schematic diagram of a fourth embodiment of the method of controlling a resolution of a digital pulse width modulation of the present disclosure. The FIG. 4B is a schematic diagram of a fifth embodiment of the method of controlling a resolution of a digital pulse width modulation of the present disclosure.

As shown in the FIG. 4A, the fourth embodiment of the present disclosure is substantially the same as the first embodiment described above, except that the first duty clock is 80 clocks.

When confirming that the modulation command has not been received, the first PWM period clock (i.e., 100 clocks) remains unchanged (i.e., the maximum operating frequency of the DPWM generator is maintained), increasing the value of the first duty clock. (i.e., 80 clocks) by a second specific value (i.e., 1 clock) to generate a second duty clock (i.e., 81 clocks). As shown in (c) of the FIG. 4A, dividing a value of the second duty clock (i.e., 81 clocks) by the value of the first PWM period clock (i.e., 100 clocks) to generate a third resolution (i.e., 81/100=81%). After confirming that the modulation command has not been received and the third resolution is not generated, if a stop command (not shown) is not explicitly received or if all process has not been stopped, it is re-executed to confirm whether or not the modulation command has been received.

When confirming that the modulation command has been received, the first duty clock (i.e., 80 clocks) remains unchanged, subtracting a first specific value (i.e., 1 clock) from the value of the first PWM period clock (i.e., 100 clocks) to generate a second PWM period clock (i.e., 99 clocks). As shown in (b) of the FIG. 4A, dividing the value of the first duty clock (i.e., 80 clocks) by a value of the second PWM period clock (i.e., 99 clocks) to generate a second resolution (i.e., 80/99=80.8%).

By analogy, based on (c) of the FIG. 4A, the resolution at the next stage is 81.8% within (d) of the FIG. 4A, and 82% within (e) of the FIG. 4A. The fourth embodiment of the present disclosure creates a resolution of 80.8% and 81.8% compared to the conventional method without increasing the maximum operating frequency of the DPWM generator. The conventional method can only provide the resolution is 80%, 81% and 82%.

As shown in the FIG. 4B, the fifth embodiment of the present disclosure is substantially the same as the fourth embodiment described above, except that the first specific value and the second specific value both are 2 clocks.

When confirming that the modulation command has not been received, the first PWM period clock (i.e., 100 clocks) remains unchanged (i.e., the maximum operating frequency of the DPWM generator is maintained), increasing the value of the first duty clock (i.e., 80 clocks) by a second specific value (i.e., 2 clocks) to generate a second duty clock (i.e., 82 clocks). As shown in (c) of the FIG. 4B, dividing a value of the second duty clock (i.e., 82 clocks) by the value of the first PWM period clock (i.e., 100 clocks) to generate a third resolution (i.e., 82/100=82%). After confirming that the modulation command has not been received and the third resolution is not generated, if a stop command (not shown) is not explicitly received or if all process has not been stopped, it is re-executed to confirm whether or not the modulation command has been received.

When confirming that the modulation command has been received, the first duty clock (i.e., 80 clocks) remains unchanged, subtracting a first specific value (i.e., 2 clock) from the value of the first PWM period clock (i.e., 100 clocks) to generate a second PWM period clock (i.e., 98 clocks). As shown in (b) of the FIG. 4B, dividing the value of the first duty clock (i.e., 80 clocks) by a value of the second PWM period clock (i.e., 98 clocks) to generate a second resolution (i.e., 80/98=81.63%).

By analogy, based on (c) of the FIG. 4B, the resolution at the next stage is 83.67% within (d) of the FIG. 4B, and 84% within (e) of the FIG. 4B. The third embodiment of the present disclosure creates a resolution of 81.63% and 83.67% compared to the conventional method without increasing the maximum operating frequency of the DPWM generator. The conventional method can only provide the resolution is 80%, 82% and 84%.

In addition, if the first specific value and the second specific value are not used in an appropriate configuration (for example, the first specific value is half of the value of the first PWM period clock, and the second specific value is half of the value of the first duty clock), this may cause adjustment of the resolution to be out of order, and may even cause limit cycle oscillations of output voltage and current ripples of output current. For example, in the sixth embodiment (not shown) of the present disclosure, the first duty clock is 20 clocks, and the first PWM period clock is 100 clocks. The first specific value (i.e., 10 clocks) is half of the value of the first PWM period clock, and the second specific value (i.e., 50 clocks) is half of the value of the first duty clock. At this time, the first resolution is 20%, and the second resolution is 13.33%. The first resolution of second order (i.e., the next first level) is 30%, and the second resolution of the second order is 20%. The first resolution of third order (i.e., the next second level) is 40%, and the second resolution of the third order is 26.67%. The conventional method can only provide the resolution is 20%, 30% and 40%. However, if the modulation command has been received, the order of adjustment may become as below: 20% →13.33% → 30% →20% →40% →26.67%. It can be found from the above numerical values that in such a modulation process, the numerical value exhibits an unstable phenomenon (a high and low fluctuation in the waveform diagram). And the value of the modulation is more divergent than the value obtained by the conventional method (the difference between 13.33% and 20% is 6.67%, the difference between 20% and 30% is 10%, and the difference between 26.67% and 40% is 13.33% ), which may cause to generate limit cycle oscillations of output voltage and current ripples of output current. To this end, the first specific value should be less than half the value of the first pulse width modulation period clock, and the second specific value should be less than half the value of the first counter pulse width clock.

To this end, the present disclosure can improve the accuracy of the controllable resolution (i.e., the resolution of digital pulse width modulation) by an appropriate configuration of the modulation command, the first specific value, and the second specific value. The output resolution can be approximated or matched with a smaller adjustment range. It is easy for the user to obtain the required output resolution while avoid to generate limit cycle oscillations of output voltage and current ripples of output current. Thereby, achieving the purpose of easy to operate, reducing power components and improving the quality of the output signal. Further, the PFM method with minimal required adjustment also helps to disperse electromagnetic interference (EMI) in whole spectrum and can reduce an influence by EMI.

The above is only a detailed description and drawings of the preferred embodiments of the present disclosure, but the features of the present disclosure are not limited thereto, and are not intended to limit the present disclosure. All the scope of the present disclosure shall be subject to the scope of the following claims. The embodiments of the spirit of the present disclosure and its similar variations are intended to be included in the scope of the present disclosure. Any variation or modification that can be easily conceived by those skilled in the art in the field of the present disclosure can be covered by the following claims.

What is claimed is:

1. A method of controlling a resolution of digital pulse width modulation in a digital pulse width modulation generator, the method comprising following steps of:
   generating a first duty clock and a first pulse width modulation period clock, and dividing a value of the first duty clock by a value of the first pulse width modulation period clock to generate a first resolution,
   remaining unchanged the first duty clock when confirming that a modulation command has been received, subtracting a first specific value from the value of the first pulse width modulation period clock to generate a second pulse width modulation period clock, and dividing the value of the first duty clock by a value of the second pulse width modulation period clock to generate a second resolution, and
   remaining unchanged the first pulse width modulation period clock when confirming that the modulation command has not been received, increasing the value of the first duty clock by a second specific value to generate a second duty clock, and dividing a value of the second duty clock by the value of the first pulse width modulation period clock to generate a third resolution,
   wherein, the second resolution is greater than the first resolution, and the second resolution is less than the third resolution.

2. The method of controlling a resolution of digital pulse width modulation in claim 1, further comprising following steps of:
   repeatedly receiving a control amount including a plurality of bits, and
   deleting the last bit of the last control amount, and the second to last bit of the control quantity used as the modulation command.

3. The method of controlling a resolution of digital pulse width modulation in claim 1, wherein the first specific value is a least significant bit of duty cycle of the first pulse width modulation period clock, the second specific value is a least significant bit of duty cycle of the first duty clock.

4. The method of controlling a resolution of digital pulse width modulation in claim 1, wherein the first specific value is equal to the second specific value.

5. The method of controlling a resolution of digital pulse width modulation in claim 1, wherein the first specific value is less than half of the value of the first pulse width modulation period clock, and the second specific value is less than half of the value of the first duty clock.

* * * * *